United States Patent
Lou et al.

(10) Patent No.: US 12,178,075 B2
(45) Date of Patent: Dec. 24, 2024

(54) DISPLAY PANEL AND DISPLAY APPARATUS

(71) Applicant: KunShan Go-Visionox Opto-Electronics Co., Ltd, Jiangsu (CN)

(72) Inventors: Junhui Lou, Kunshan (CN); Lu Zhang, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 636 days.

(21) Appl. No.: 17/470,234

(22) Filed: Sep. 9, 2021

(65) Prior Publication Data

US 2021/0408152 A1  Dec. 30, 2021

Related U.S. Application Data

(63) Continuation of application No. PCT/CN2020/092581, filed on May 27, 2020.

(30) Foreign Application Priority Data

Aug. 2, 2019 (CN) .......................... 201921248018.8

(51) Int. Cl.
*H10K 59/121* (2023.01)
*H10K 50/813* (2023.01)
(Continued)

(52) U.S. Cl.
CPC ..... *H10K 59/121* (2023.02); *H10K 59/80521* (2023.02); *H10K 50/813* (2023.02);
(Continued)

(58) Field of Classification Search
CPC ........... H10K 59/121; H10K 59/80521; H10K 50/813; H10K 50/822; H10K 59/35; H10K 59/805; H10K 59/80515
See application file for complete search history.

(56) References Cited

U.S. PATENT DOCUMENTS

2012/0153321 A1  6/2012  Chung et al.
2017/0236883 A1*  8/2017  Madigan .............. H10K 59/122
                                                              257/40
(Continued)

FOREIGN PATENT DOCUMENTS

CN  104795434 A  7/2015
CN  108389879 A  8/2018
(Continued)

OTHER PUBLICATIONS

P. E. Burrows, G. Gu, S. R. Forrest, E. P. Vicenzi, T. X. Zhou; Semitransparent cathodes for organic light emitting devices. J. Appl. Phys. Mar. 15, 2000; 87 (6): 3080-3085. (Year: 2000).*
(Continued)

*Primary Examiner* — Joseph C. Nicely
*Assistant Examiner* — Alvin L Lee
(74) *Attorney, Agent, or Firm* — Maier & Maier, PLLC

(57) ABSTRACT

A display panel and a display apparatus. The display panel includes a first display area and a second display area. A light transmittance of the first display area is greater than a light transmittance of the second display area. The display panel includes: first pixels located in the first display area, each first pixel includes a plurality of first sub-pixels and each of the first sub-pixels includes a first pixel electrode; and second pixels located in the second display area, each second pixel includes a plurality of second sub-pixels and each of the second sub-pixels includes a second pixel electrode. Among the first sub-pixels and the second sub-pixels of a same color, an area of the first pixel electrode of one first sub-pixel is smaller than an area of the second pixel electrode of one second sub-pixel.

25 Claims, 9 Drawing Sheets

(51) Int. Cl.
*H10K 50/822* (2023.01)
*H10K 50/828* (2023.01)
*H10K 59/35* (2023.01)
*H10K 59/80* (2023.01)

(52) U.S. Cl.
CPC ......... *H10K 50/822* (2023.02); *H10K 50/828* (2023.02); *H10K 59/35* (2023.02); *H10K 59/805* (2023.02)

(56) References Cited

U.S. PATENT DOCUMENTS

| | | | | |
|---|---|---|---|---|
| 2019/0181201 | A1* | 6/2019 | Kim | H10K 59/122 |
| 2020/0006440 | A1* | 1/2020 | Liao | H10K 50/82 |
| 2020/0251539 | A1* | 8/2020 | Fu | H10K 59/12 |
| 2020/0357998 | A1* | 11/2020 | Bai | C23C 14/042 |
| 2021/0371968 | A1* | 12/2021 | Higuchi | C23C 14/042 |

FOREIGN PATENT DOCUMENTS

| | | |
|---|---|---|
| CN | 108615008 A | 10/2018 |
| CN | 109697396 A | 4/2019 |
| CN | 109801950 A | 5/2019 |
| CN | 110752249 A | 2/2020 |
| CN | 210245502 U | 4/2020 |
| CN | 210575958 U | 5/2020 |
| CN | 111312755 A | 6/2020 |

OTHER PUBLICATIONS

International Search Report with English translation and Written Opinion of the International Searching Authority issued on Aug. 18, 2020 in corresponding International application No. PCT/CN2020/092581; 13 pages.

* cited by examiner

DISPLAY PANEL AND DISPLAY APPARATUS

CROSS REFERENCE TO RELATED APPLICATION

The application is a continuation of International Application No. PCT/CN2020/092581 filed on May 27, 2020, which claims the priority to Chinese Patent Application No. 201921248018.8, filed on Aug. 2, 2019 and entitled "DISPLAY PANEL AND DISPLAY APPARATUS", both of which are incorporated herein by reference in their entireties.

TECHNICAL FIELD

The application relates to the technical field of display, and particularly to a display panel and a display apparatus.

BACKGROUND

With rapid development of electronic devices, users are demanding a higher and higher screen-to-body ratio, which makes a full-screen display of the electronic devices attract more and more attention in the industry.

Traditional electronic devices such as a cell phone and a tablet computer need to integrate a front-facing camera, an earpiece, an infrared sensing element and the like. Conventionally, a notch or a hole may be formed on a display screen, and external light may enter a photosensitive element located below the screen via the notch or the hole on the screen. However, these electronic devices are not really full-screen electronic devices, and cannot perform display in all areas of the entire screen. For example, an area corresponding to the front-facing camera cannot display pictures.

SUMMARY

Embodiments of the present application provide a display panel and a display apparatus.

In an aspect, an embodiment of the present application provides a display panel including a first display area and a second display area. A light transmittance of the first display area is greater than a light transmittance of the second display area. The display panel includes: first pixels located in the first display area, wherein each of the first pixels includes a plurality of first sub-pixels and each of the first sub-pixels includes a first pixel electrode; and second pixels located in the second display area, wherein each of the second pixels includes a plurality of second sub-pixels and each of the second sub-pixels includes a second pixel electrode. Among the first sub-pixels and the second sub-pixels of a same color, an area of the first pixel electrode of one of the first sub-pixels is smaller than an area of the second pixel electrode of one of the second sub-pixels.

In another aspect, an embodiment of the present application provides a display apparatus including the above-described display panel.

In the display panel according to the embodiment of the present application, the light transmittance of the first display area is greater than the light transmittance of the second display area. The area of the first pixel electrode of the first sub-pixel in the first display area is smaller than the area of the second pixel electrode of the second sub-pixel of the same color as the first sub-pixel in the second display area, so that each first pixel in the first display area may have more areas where a light-transmitting structure can be arranged, thereby improving the light transmittance of the first display area and facilitating the under-screen integration of the photosensitive component.

Since the area of the first pixel electrode in the first display area is small enough, any area around the first pixel electrode can be configured as a light-transmitting area, and thus a light transmittance requirement of the first display area can be met. Under a condition of ensuring that the light transmittance requirement of the first display area has been met, the first pixel electrode in the first display area and the second pixel electrode in the second display area can be configured with a same composition and a similar structure, so that brightness, color coordinates and the like of the first sub-pixels and the second sub-pixels of the same color at various viewing angles may tend to be consistent, thereby improving uniformity of display performance of the display panel.

BRIEF DESCRIPTION OF THE DRAWINGS

Other features, objectives, and advantages of the present application will become more apparent by reading the following detailed description of non-limiting embodiments with reference to the accompanying drawings, in which the same or similar reference numerals represent the same or similar features. The accompanying drawings are not drawn to actual scale.

DETAILED DESCRIPTION

In order to make the objectives, technical solutions, and advantages of the present application more clear, the present application will be described in detail below with reference to the accompanying drawings and specific embodiments. It should be understood that the specific embodiments described herein are only configured to explain the present application, and not configured to limit the present application. For those skilled in the art, the present application can be implemented without some of these specific details.

In an electronic device such as a cell phone and a tablet computer, it is desired to integrate a photosensitive component such as a front-facing camera, an infrared light sensor, and a proximity light sensor on a side where a display panel is arranged. In some embodiments, a light-transmitting display area may be arranged in the above electronic device, the photosensitive component is arranged on the back of the light-transmitting display area, and a full-screen display is achieved for the electronic device while the photosensitive component is guaranteed to work normally.

In order to form the aforementioned light-transmitting display area, the structure of the display panel in the light-transmitting display area is usually made of a light-transmitting material. In some technical solutions, in the light-transmitting display area of the display panel, an anode of a sub-pixel may be configured as a light-transmitting conductive layer, while in a non-light-transmitting display area of the display panel, the anode of the sub-pixel is usually a reflective electrode, so there are differences in viewing angles and color coordinates between the light-transmitting display area and the non-light-transmitting display area of the panel, which affects uniformity of the display of the display panel.

In order to solve the above problem, embodiments of the present application provide a display panel and a display apparatus. Various embodiments of the display panel and the display apparatus will be described below with reference to the drawings.

An embodiment of the present application provides a display panel, which may be an Organic Light Emitting Diode (OLED) display panel.

Figure 1:
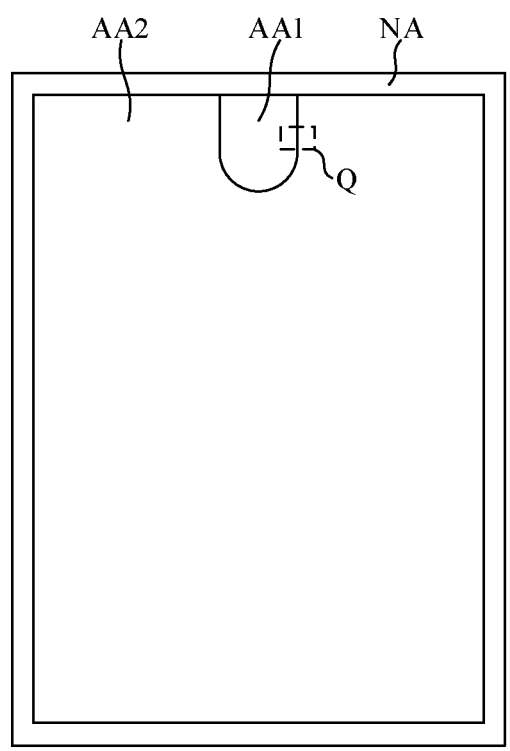
FIG. 1 is a schematic top view of a display panel provided according to an embodiment of the present application.
Figure 2:
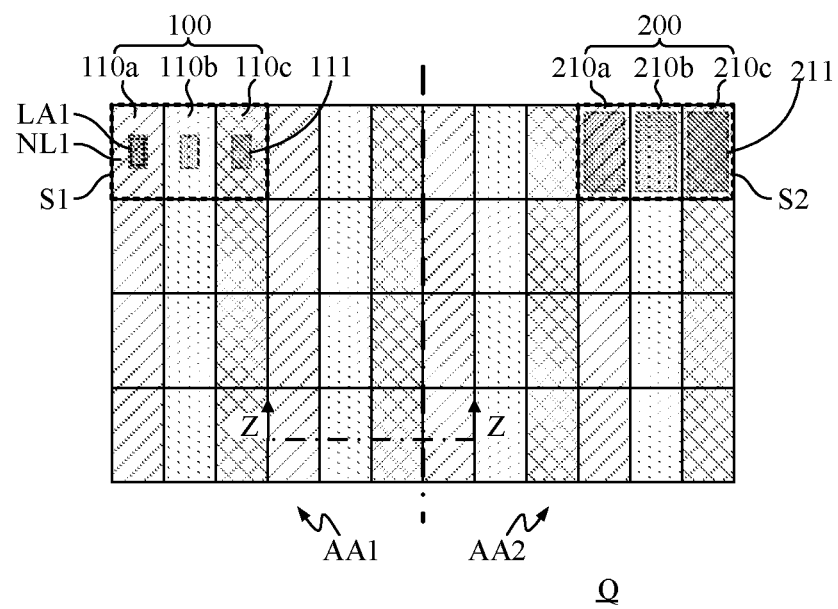
FIG. 2 is a partial enlarged view of the area Q in FIG. 1 according to an example.
Figure 3:
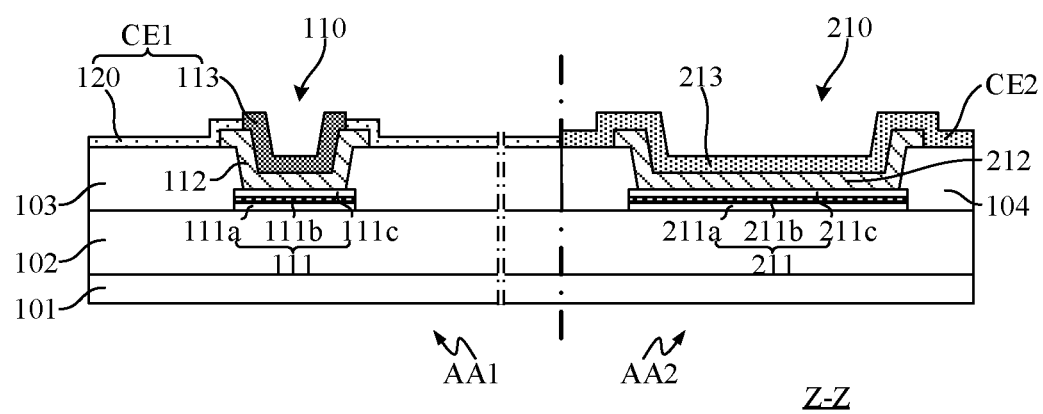
FIG. 3 is a cross-sectional view along the Z-Z direction in FIG. 2.

FIG. 1 is a schematic top view of a display panel provided according to an embodiment of the present application, FIG. 2 is a partial enlarged view of the area Q in FIG. 1, and FIG. 3 is a cross-sectional view along the Z-Z direction in FIG. 2.

The display panel 1000 includes a first display area AA1, a second display area AA2, and a non-display area NA surrounding the first display area AA1 and the second display area AA2. The light transmittance of the first display area AA1 is greater than the light transmittance of the second display area AA2. In some embodiments, the light transmittance of the first display area AA1 is greater than or equal to 15%, and the light transmittance of the second display area AA2 is less than 15%.

The display panel 1000 includes a plurality of first pixels 100 and a plurality of second pixels 200. The first pixels 100 are located in the first display area AA1. Each first pixel 100 includes a plurality of first sub-pixels 110, and each first sub-pixel 110 includes a first pixel electrode 111. The second pixels 200 are located in the second display area AA2. Each second pixel 200 includes a plurality of second sub-pixels 210, and each second sub-pixel 210 includes a second pixel electrode 211.

As shown in FIG. 2, the first sub-pixel 110 in the first display area AA1 includes a red first sub-pixel 110*a,* a green first sub-pixel 110*b,* and a blue first sub-pixel 110*c.* In some embodiments, each first pixel 100 includes one red first sub-pixel 110*a,* one green first sub-pixel 110*b,* and one blue first sub-pixel 110*c.* Similarly, each second pixel 200 may include one red second sub-pixel 210*a,* one green second sub-pixel 210*b,* and one blue second sub-pixel 210*c.*

The number and color types of the sub-pixels included in each first pixel 100 or each second pixel 200 may be adjusted according to design requirements of the display panel 1000, and thus are not limited to the examples of the foregoing embodiments. In addition, the arrangement of the sub-pixels in each first pixel 100 or each second pixel 200 is not limited to the example of the foregoing embodiment.

Figure 4:
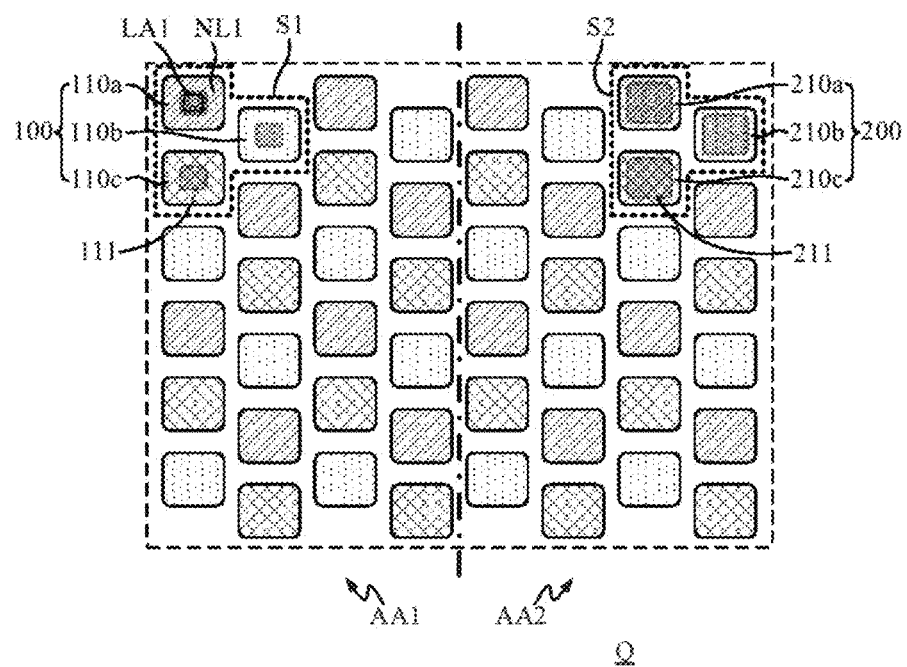
FIG. 4 is a partial enlarged view of the area Q in FIG. 1 according to another example.

FIG. 4 is a partial enlarged view of the area Q in FIG. 1 according to another example. The arrangement of the first sub-pixels 110 in the first display area AA1 in the embodiment of FIG. 4 is different from another arrangement of the first sub-pixels 110 in the first display area AA1 in the embodiment of FIG. 2. The arrangement of the second sub-pixels 210 in the second display area AA2 in the embodiment of FIG. 4 is also different from the arrangement of the second sub-pixels 210 in the second display area AA2 in the embodiment of FIG. 2.

As shown in FIG. 2 or FIG. 4, in the display panel 1000 of the embodiments of the present application, among the first sub-pixels 110 and the second sub-pixels 210 of the same color, an area of the first pixel electrode 111 of the first sub-pixel 110 is smaller than an area of the second pixel electrode 211 of the second sub-pixel 210.

In the display panel 1000 according to the embodiment of the present application, the light transmittance of the first display area AA1 is greater than the light transmittance of the second display area AA2. In a group including the first sub-pixel 110 and the second sub-pixel 210 of a same color, with the first sub-pixel 110 positioned in the first display area AA1 and the second sub-pixel 210 positioned in the second display area AA2, the area of the first pixel electrode 111 of the first sub-pixel 110 in the first display area AA1 is smaller than the area of the second pixel electrode 211 of the second sub-pixel 210, so that each first pixel 100 in the first display area AA1 may have more areas where the light-transmitting structure can be arranged, thereby improving the light transmittance of the first display area AA1 and facilitating the under-screen integration of the photosensitive component.

Since the area of the first pixel electrode 111 in the first display area AA1 is small enough, any area around the first pixel electrode 111 can be configured as the light-transmitting area, and thus the light transmittance requirement of the first display area AA1 can be met. Under the condition of ensuring that the light transmittance requirement of the first display area AA1 has been met, the first pixel electrode 111 in the first display area AA1 and the second pixel electrode 211 in the second display area AA2 can be configured with the same composition and the similar structure, so that parameters such as the brightness and the color coordinates of the first sub-pixel 110 and the second sub-pixel 210 of the same color at various viewing angles may be consistent, thereby improving uniformity of display performance of the display panel 1000.

Optionally, the first pixel electrode 111 and the second pixel electrode 211 have the same layer structure. Optionally, the first pixel electrode 111 and the second pixel electrode 211 have the same thickness. By configuring the first pixel electrode 111 and the second pixel electrode 211 to have the same layer structure and/or the same thickness, parameters such as display viewing angles and color coordinates of the first display area AA1 and the second display area AA2 may tend to be consistent, which greatly improves a display difference between the first display area AA1 and the second display area AA2 and improves a display integration effect of the display panel 1000.

Optionally, the second pixel electrode 112 is a reflective electrode; the first pixel electrode 111 is a reflective electrode. That is, the first pixel electrode 111 and the second pixel electrode 112 include a reflective layer.

As shown in FIG. 3, in this embodiment, the first pixel electrode 111 includes a first transparent conductive layer 111a, a first metal layer 111b located on the first transparent conductive layer 111a, and a second transparent conductive layer 111c located on the first metal layer 111b. The first transparent conductive layer 111a and the second transparent conductive layer 111c may be made of a material such as indium tin oxide (ITO) and indium zinc oxide. The first metal layer 111b serves as a reflective layer and may be made of metal such as silver.

The second pixel electrode 211 includes a third transparent conductive layer 211a, a second metal layer 211b located on the third transparent conductive layer 211a, and a fourth transparent conductive layer 211c located on the second metal layer 211b. The third transparent conductive layer 211a and the fourth transparent conductive layer 211c may be made of a material such as ITO and indium zinc oxide. The second metal layer 211b serves as a reflective layer and may be made of metal such as silver.

In some embodiments, the first pixel electrode 111 is located in a non-edge area corresponding to the first sub-pixel 110, for example, located in a center of the corresponding first sub-pixel 110. In each first sub-pixel 110, the area around the first pixel electrode 111 is a non-light-emitting area. In some embodiments, the non-light-emitting area transmits light, so that the light-transmitting area in each first sub-pixel 110 surrounds the area occupied by the first pixel electrode 111.

As shown in FIG. 3, each first sub-pixel 110 further includes a first light-emitting structure 112 located on the first pixel electrode 111 and a first electrode block 113 located on the first light-emitting structure 112. In each first sub-pixel 110, an orthographic projection of the first electrode block 113 on a plane where the first pixel electrode 111 is located at least partially overlaps the first pixel electrode 111.

Optionally, the first pixel electrode 111 is the anode of the first sub-pixel 110, and the first electrode block 113 is the cathode of the first sub-pixel 110.

Optionally, a plurality of first electrode blocks 113 are spaced apart from each other.

Optionally, the first electrode blocks 113 of at least some of the first sub-pixels 110 are interconnected via a connection portion 120 to form a first common electrode CE1. The first common electrode CE1 covers at least a part of the first display area AA1.

Each second sub-pixel 210 further includes a second light-emitting structure 212 located on the second pixel electrode 211 and a second electrode block 213 located on the second light-emitting structure 212. The second electrode blocks 213 of at least some of the second sub-pixels 210 are interconnected to form a second common electrode CE2. The second common electrode CE2 covers at least a part of the second display area AA2.

Optionally, the second pixel electrode 211 is the anode of the second sub-pixel 210, and the second electrode block 213 is the cathode of the second sub-pixel 210.

Optionally, the light transmittance of the first electrode block 113 is the same as the light transmittance of the second common electrode CE2. Specifically, the first electrode block 113 and the second common electrode CE2 may be magnesium-silver alloy layers, and the thickness of the first electrode block 113 is equal to the thickness of the second common electrode CE2.

By configuring the first electrode block 113 and the second common electrode CE2 to have the same light transmittance, the structures and materials of the first electrode block 113 of the first sub-pixel 111 and the second electrode block 213 of the second sub-pixel 211 of the same color tend to be consistent, which improves consistency of light emission of the first sub-pixel 111 and the second sub-pixel 211 of the same color and reduces display unevenness and viewing angle difference of the display panel 1000.

In the display panel 1000 of the embodiment of the present application, the first pixel electrode 111 in the first display area AA1 may be configured as the same reflective electrode as the second pixel electrode 112 in the second display area AA2, and both the first pixel electrode 111 and the second pixel electrode 112 may be configured to have the same layer structure and the same thickness. Moreover, the first electrode block 113 of the first display area AA1 is configured to have the same material and thickness as the second common electrode CE2 of the second display area AA2, so that the layer structures of the first sub-pixel 111 and the second sub-pixel 211 are basically consistent, thereby better eliminating the viewing angle difference and the color coordinate difference between the first display area AA1 and the second display area AA2. Compared with the technical solution of using a light-transmitting conductive material as the first pixel electrode 111 in the first display area AA1, the display panel 1000 of the embodiment of the present application has more significant effects as described above.

Figure 5:
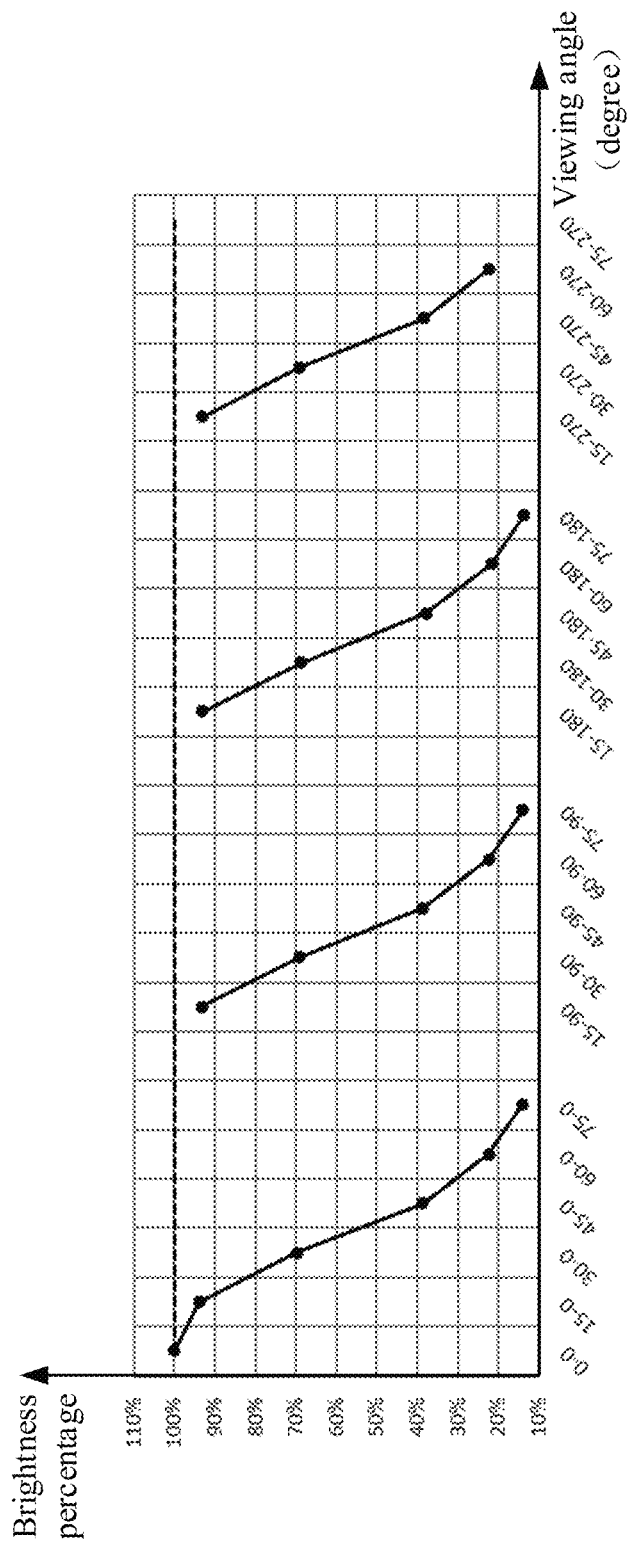
FIG. 5 is a diagram showing a relationship between a viewing angle and a brightness percentage of a first display area in a display panel provided according to an embodiment of the present application.
Figure 6:
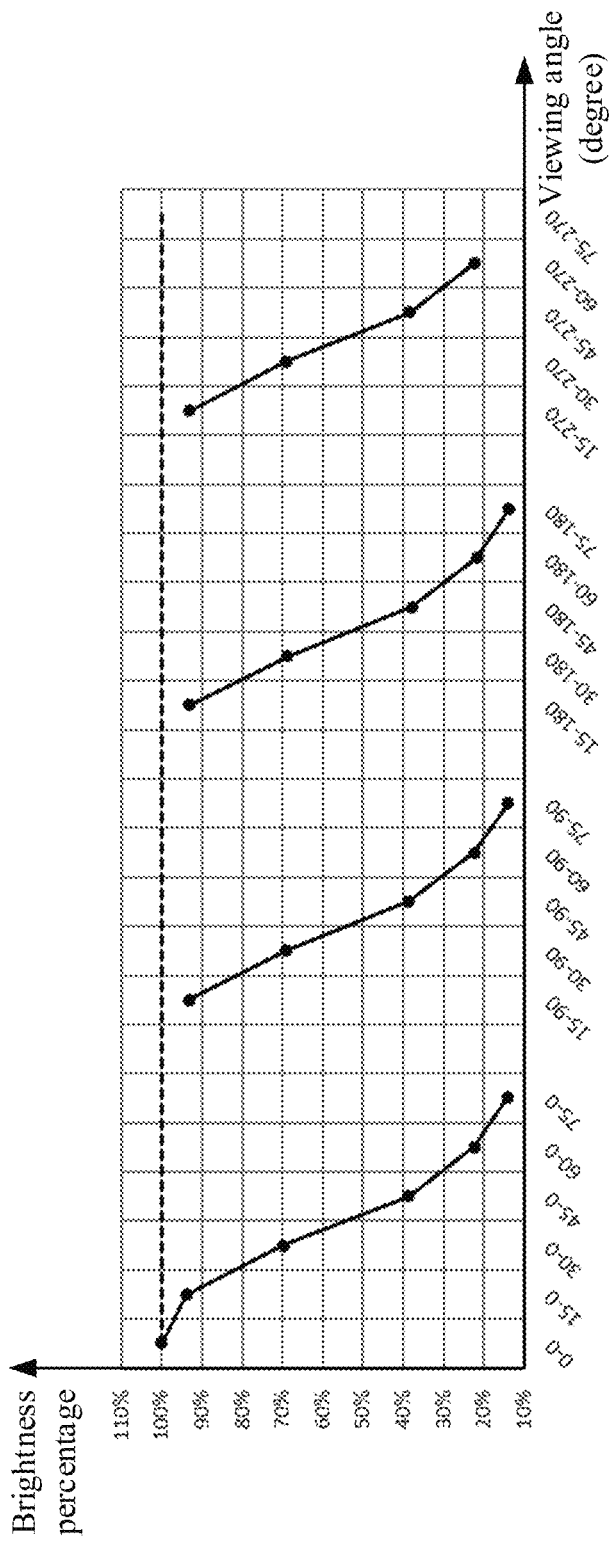
FIG. 6 is a diagram showing a relationship between a viewing angle and a brightness percentage of a second display area in a display panel provided according to an embodiment of the present application.
Figure 7:
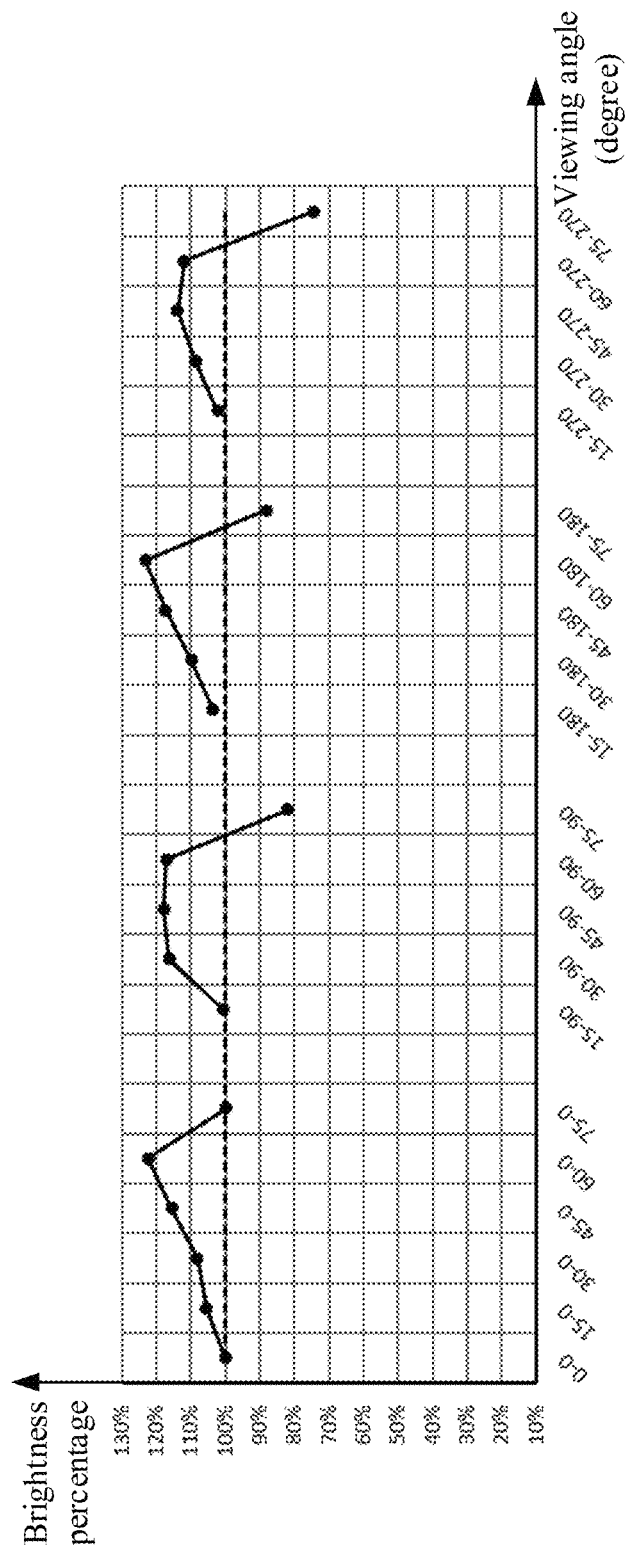
FIG. 7 is a diagram showing a relationship between a viewing angle and a brightness percentage of a first display area in a display panel provided by a comparative example.

FIG. 5 is a diagram showing a relationship between a viewing angle and a brightness percentage of a first display area in a display panel provided according to an embodiment of the present application. FIG. 6 is a diagram showing a relationship between a viewing angle and a brightness percentage of a second display area in a display panel provided according to an embodiment of the present application. FIG. 7 is a diagram showing a relationship between a viewing angle and a brightness percentage of a first display area in a display panel provided by a comparative example. In the comparative example related to FIG. 7, the first pixel electrode in the first display area of the display panel is made of a light-transmitting conductive material, and the other structure of the first display area is the same as that of the first display area of the display panel related to FIG. 5; the structure of the second display area of the comparative example related to FIG. 7 is the same as that of the second display area of the display panel related to FIG. 6, so the relationship between the viewing angle and the brightness percentage is the same as that shown in FIG. 6.

According to FIG. 6 and FIG. 7, it can be seen that in the comparative example using the light-transmitting conductive material as the first pixel electrode, the first display area and the second display area have a large difference in brightness at various viewing angles, and it is difficult to visually fuse the first display area and the second display area together. According to FIG. 5 and FIG. 6, it can be seen that the brightness performance of the first display area and the second display area of the embodiment of the present application is basically consistent at various viewing angles, thereby greatly reducing the viewing angle difference between the first display area and the second display area, and improving the integrated display effect of the display panel 1000.

In addition, by configuring the first electrode block 113 in the first display area AA1 and the second common electrode CE2 in the second display area AA2 to have the same material and thickness, the layer structures of the first sub-pixel 111 and the second sub-pixel 211 can be basically consistent and the color coordinates of the first display area AA1 and the second display area AA2 can be basically consistent, thereby further improving the integrated display effect of the display panel 1000.

Optionally, in the first common electrode CE1, the light transmittance of the connection portion 120 is greater than the light transmittance of the first electrode block 113. In some embodiments, the first common electrode CE1 is a magnesium-silver alloy layer, and the thickness of the connection portion 120 is smaller than the thickness of the first electrode block 113. By configuring the connection portion 120 to have a light transmittance greater than the light transmittance of the first electrode block 113, the light transmittance of the first non-light-emitting area NL1 can be increased while ensuring that the first sub-pixel 111 has a high light-emitting efficiency, thereby increasing the light transmittance of the entire first display area AA1.

As shown in FIG. 3, the display panel 1000 may include a substrate 101, a device layer 102 located on the substrate 101, and a first pixel definition layer 103 and a second pixel definition layer 104 located on the device layer 102. The first pixel definition layer 103 is located in the first display area AA1. The first pixel definition layer 103 includes a plurality of first pixel openings, and each first pixel opening correspondingly accommodates the first light-emitting structure 112 of one first sub-pixel 110. The first pixel definition layer 103 may be made of a light-transmitting material. The second pixel definition layer 104 is located in the second display area AA2. The second pixel definition layer 104 includes a plurality of second pixel openings, and each second pixel opening correspondingly accommodates the second light-emitting structure 212 of one second sub-pixel 210.

Optionally, the shape of the first pixel electrode 111 is substantially rectangular. In some other embodiments, the shape of the first pixel electrode 111 may not be limited to the above example.

Figure 8:
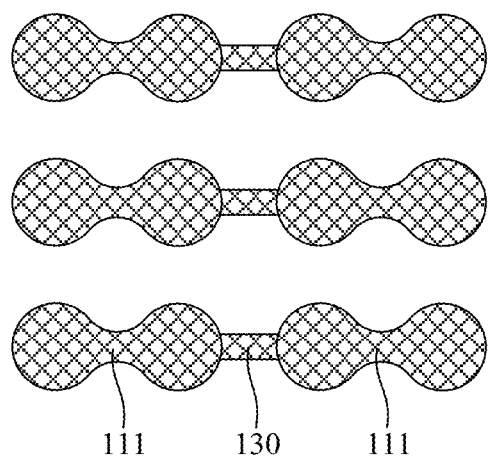
FIG. 8 is a schematic top view of another example of a first pixel electrode in a display panel provided according to an embodiment of the present application.

FIG. 8 is a schematic top view of another example of a first pixel electrode in a display panel provided according to an embodiment of the present application. The orthographic projection of each first pixel electrode 111 on the substrate 101 is substantially a dumb-bell shape. In some other embodiments, the orthographic projection of each first pixel electrode 111 on the substrate 101 includes one first graphic unit or two or more first graphic units jointed together. The shape of first graphic unit includes a shape or a combination of shapes selected from a round shape, an oval shape, a dumb-bell shape, a gourd shape and a rectangle shape. By reasonably configuring the shape of the first pixel electrode 111, the light diffraction phenomenon of the first display area AA1 can be reduced.

In some embodiments, every m first pixel electrodes 111 are connected to each other and are electrically connected with one first pixel circuit, where m is an integer greater than or equal to 2. For example, in the embodiment shown in FIG. 8, every two first pixel electrodes 111 are connected to each other to reduce the number of first pixel circuits used to drive the first pixel electrodes 111, thereby reducing an occupied area of the first pixel circuits on the display panel 1000. In some embodiments, adjacent first pixel electrodes 111 are connected to each other through an interconnect structure 130.

In addition, in some embodiments, the orthographic projection of each first light-emitting structure 112 on the substrate 101 includes one second graphic unit or two or more second graphic units jointed together, and the second graphic unit includes at least one selected from a group including a round shape, an oval shape, a dumb-bell shape, a gourd shape and a rectangle shape. By configuring the shape of the first light-emitting structure 112 as described above, the light diffraction phenomenon of the first display area AA1 can be reduced.

As shown in FIG. 2 or FIG. 4, in some embodiments, a pixel density of the first pixels 100 is the same as a pixel density of the second pixels 200. In some embodiments, a pixel arrangement of the first pixels 100 is the same as a pixel arrangement of the second pixels 200.

In FIG. 2 and FIG. 4, a pixel area of one first pixel 100 is shown by a dashed frame S1, and a pixel area of one second pixel 200 is shown by a dashed frame S2. In some embodiments, the pixel area S1 of one first pixel 100 is equal to the pixel area S2 of one second pixel 200.

Optionally, among a group including the first sub-pixels 110 and the second sub-pixels 210 of the same color, a ratio of the area of the first pixel electrode 111 of one of the first sub-pixels 110 to the area of the second pixel electrode 211 of one of the second sub-pixels 210 is in a range of 0.2 to 0.6.

Further, among the first sub-pixels 110 and the second sub-pixels 210 of the same color, the ratio of the area of the first pixel electrode 111 of one of the first sub-pixels 110 to the area of the second pixel electrode 211 of one of the second sub-pixels 210 is in a range of 0.25 to 0.6.

The following table illustrates specific values of various display parameters of the first display area AA1 under various example values of the ratio of the area of one first pixel electrode 111 to the area of one second pixel electrode 211 in the sub-pixels of the same color. For comparison, in each example in the following table, the area of the second pixel electrode 211 in the second display area AA2 is unchanged.

| Area of the first pixel electrode/ Area of the second pixel electrode | Light transmittance of the first display area | Lifetime of the first display area under the brightness of 200 nit (T95: the time for the brightness to drop to 95%) |
| --- | --- | --- |
| 0.1 | 30% | Approximately 25 hours |
| 0.2 | 27% | Approximately 70 hours |
| 0.25 | 25% | Approximately 90 hours |
| 0.3 | 22% | Approximately 120 hours |
| 0.4 | 20% | Approximately 200 hours |
| 0.6 | 17% | Approximately 250 hours |
| 0.7 | 14% | Approximately 330 hours |
| 0.8 | 12% | Approximately 420 hours |

According to the parameter values of the examples in the above table, it can be seen that when the ratio of the area of the first pixel electrode 111 of one first sub-pixel 110 to the area of the second pixel electrode 211 of one second sub-pixel 210 is in the range of 0.2 to 0.6, especially in the range of 0.25 to 0.6, the arrangement of the first pixel electrode 111 can balance the light transmittance and the service lifetime of the first display area AA1, and the first display area AA1 with a sufficient light transmittance and service lifetime can be obtained.

In some embodiments, a ratio of a total area of a plurality of first pixel electrodes 111 included in each first pixel 100 to the pixel area S1 of the first pixel 100 is in a range of 0.03 to 0.25.

Further, in some embodiments, the ratio of the total area of the plurality of first pixel electrodes 111 included in each first pixel 100 to the pixel area S1 of the first pixel 100 is in a range of 0.1 to 0.2.

The first pixel 100 includes the plurality of first pixel electrodes 111, and a ratio of the area of each first pixel electrode 111 to an equivalent area of the first sub-pixel 110 where the first pixel electrode 111 is located is equal to the ratio of the total area of the plurality of first pixel electrodes 111 to the pixel area S1 of the first pixel 100.

The following table illustrates specific values of various display parameters of the first display area AA1 under various example values of the ratio of the total area of the plurality of first pixel electrodes 111 in the first pixel 100 to the pixel area S1 of the first pixel 100.

| Total area of the plurality of first pixel electrodes in the first pixel/ Pixel area of the first pixel | Light transmittance of the first display area | Lifetime of the first display area under the brightness of 200 nit (T95: the time for the brightness to drop to 95%) |
| --- | --- | --- |
| 0.01 | 30% | Approximately 25 hours |
| 0.03 | 27% | Approximately 70 hours |
| 0.05 | 25% | Approximately 90 hours |
| 0.1 | 22% | Approximately 120 hours |
| 0.15 | 20% | Approximately 200 hours |
| 0.2 | 17% | Approximately 250 hours |
| 0.25 | 14% | Approximately 330 hours |
| 0.3 | 12% | Approximately 420 hours |

According to the parameter values of the examples in the above table, it can be seen that when the ratio of the total area of the plurality of first pixel electrodes 111 included in each first pixel 100 to the pixel area S1 of the first pixel 100 is in the range of 0.03 to 0.25, especially in the range of 0.1 to 0.2, it is possible to ensure that the first display area AA1 has a sufficient service lifetime and an increased light transmittance, thereby realizing a high-quality picture display and a sufficient service lifetime, and also facilitating the under-screen integration of the photosensitive component.

Each first sub-pixel 110 includes a first light-emitting area and a first non-light-emitting area NL1 that is complementary in shape to the first light-emitting area LA1 in the first sub-pixel 110.

Optionally, a ratio of a total area of a plurality of first light-emitting areas LA1 included in each first pixel 100 to the pixel area S1 of the first pixel 100 is in a range of 0.03 to 0.25. Further, the ratio of the total area of the plurality of first light-emitting areas LA1 included in each first pixel 100 to the pixel area S1 of the first pixel 100 is in a range of 0.08 to 0.2. By balancing the relationship between the total area of the first light-emitting areas LA1 in each first pixel 100 and the first non-light-emitting area NL1, it is possible to ensure that the first display area AA1 can display well and have a sufficient light transmittance while maintaining a good service lifetime.

Figure 9:
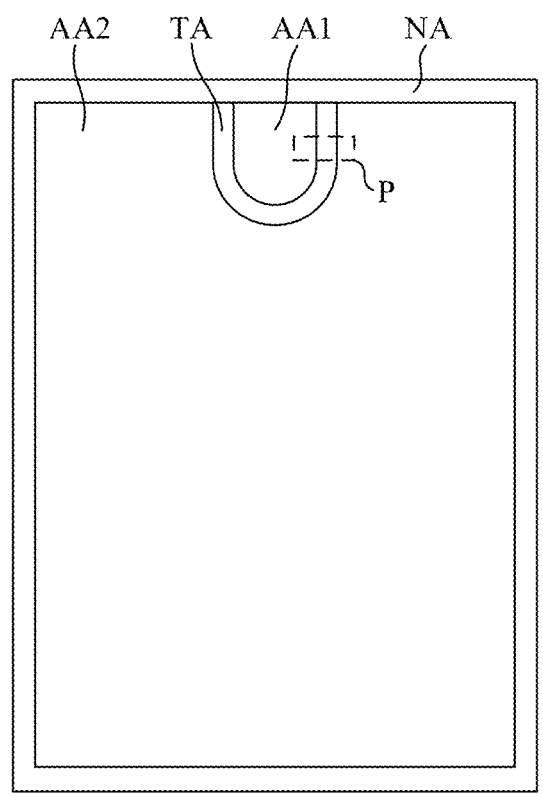
FIG. 9 is a schematic top view of a display panel provided according to another embodiment of the present application.
Figure 10:
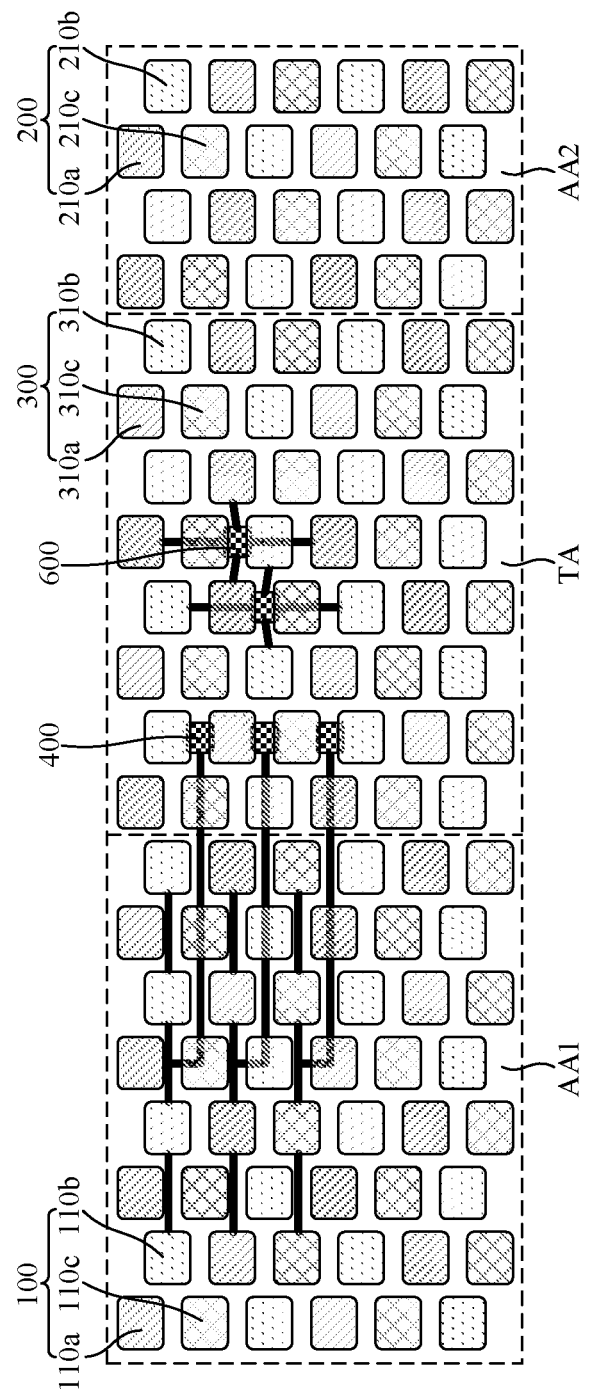
FIG. 10 is a partial enlarged view of the area P in FIG. 9 according to an example.

FIG. 9 is a schematic top view of a display panel provided according to another embodiment of the present application, and FIG. 10 is a partial enlarged view of the area P in FIG. 9 according to an example. Part of the structure of the display panel 1000 in this embodiment is similar to the foregoing embodiment. The differences between this embodiment and the foregoing embodiment will be described below, and the similarities will not be described in detail.

Different from the foregoing embodiment, the display panel 1000 in this embodiment includes not only the first display area AA1, the second display area AA2, and the non-display area NA, but also a transition display area TA between the first display area AA1 and the second display area AA2. In some embodiments, a light transmittance of the transition display area TA may be substantially the same as the light transmittance of the second display area AA2.

The display panel 1000 further includes a plurality of third pixels 300 located in the transition display area TA, and each third pixel 300 includes a plurality of third sub-pixels 310. In this embodiment, each third pixel 30 may include one red third sub-pixel 310a, one green third sub-pixel 310b, and one blue third sub-pixel 310c.

The display panel 1000 may further include a first pixel circuit 400. The first pixel circuit 400 is located in the transition display area TA, and is used to drive the first sub-pixel 110 for display. In some embodiments, each first pixel circuit 400 is electrically connected with two or more first sub-pixels 110 of the same color. In some embodiments, every predetermined number of first sub-pixels 110 of the same color in the first display area AA1 are driven by one first pixel circuit 400.

The display panel 1000 may further include a second pixel circuit (not shown in the figure), and the second pixel circuit may be located in the second display area AA2. In some embodiments, the second sub-pixel 210 and the second pixel circuit in the second display area AA2 are connected in a one-to-one correspondence, so that each second sub-pixel 210 is driven for display by a corresponding second pixel circuit.

In some embodiments, the display panel 1000 may further include a third pixel circuit 600. The third pixel circuit 600 is located in the transition display area TA, and is used to drive the third sub-pixel 310 for display. In some embodiments, each third pixel circuit 600 is electrically connected with two or more third sub-pixels 310 of the same color. In the transition display area TA, every predetermined number of third sub-pixels 310 of the same color may be driven by one third pixel circuit 600.

According to the display panel 1000 of the above embodiment, the display panel 1000 includes the first display area AA1, the second display area AA2, and the transition display area TA. The light transmittance of the first display area AA1 is greater than the light transmittances of the second display area AA2 and the transition display area TA, so that the first display area AA1 can be easily configured as an area for integrating the photosensitive component and the under-screen integration of the photosensitive component can be realized. The first pixel circuit 400 for driving the first sub-pixel 110 of the first display area AA1 for display is located in the transition display area TA, thereby reducing a wiring structure in the first display area AA1 and improving the light transmittance of the first display area AA1. The third pixel circuit 600 for driving the third sub-pixel 310 of the transition display area TA for display is electrically connected with two or more third sub-pixels 310 of the same color, thereby saving an area occupied by the third pixel circuit 600 in the transition display area TA, enabling a more reasonable arrangement of the first pixel circuit 400 and the third pixel circuit 600 in the transition display area TA and avoiding layout conflicts.

An embodiment of the present application also provides a display apparatus, which includes the display panel 1000 of any of the foregoing implementations.

Figure 11:
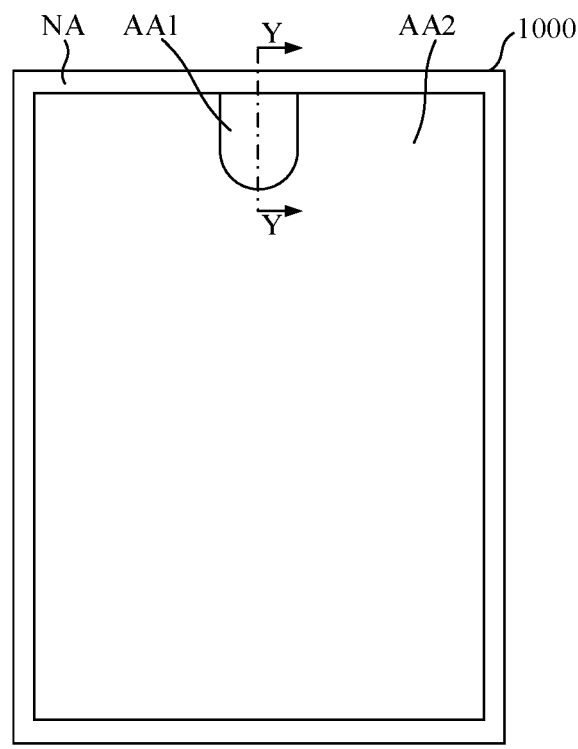
FIG. 11 is a schematic top view of a display apparatus provided according to an embodiment of the present application.
Figure 12:
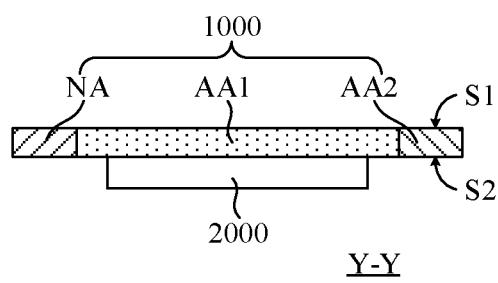
FIG. 12 is a cross-sectional view along the Y-Y direction in FIG. 11.

FIG. 11 is a schematic top view of a display apparatus provided according to an embodiment of the present application, and FIG. 12 is a cross-sectional view along the Y-Y direction in FIG. 11. In the display apparatus of this embodiment, the display panel 1000 is the display panel of one of the above embodiments, and includes the first display area AA1, the second display area AA2, and the non-display area NA surrounding the first display area AA1 and the second display area AA2. The light transmittance of the first display area AA1 is greater than the light transmittance of the second display area AA2.

The display panel 1000 includes a first surface S1 and a second surface S2 opposite to each other, and the first surface S1 is a display surface. The display apparatus further includes a photosensitive component 2000, which is located on the second surface S2 side of the display panel 1000 and corresponds to the position of the second display area AA2.

The photosensitive component 2000 may be an image acquisition device for acquiring external image information. In this embodiment, the photosensitive component 2000 is a Complementary Metal Oxide Semiconductor (CMOS) image acquisition device. In some other embodiments, the photosensitive component 2000 may also be other types of image acquisition devices such as a Charge-coupled Device (CCD) image acquisition device. It can be understood that the photosensitive component 2000 may not be limited to the image acquisition device. For example, in some embodiments, the photosensitive component 2000 may also be a light sensor such as an infrared sensor or a proximity sensor.

According to the display apparatus of the embodiment of the present application, the light transmittance of the first display area AA1 of the display panel 1000 is greater than the light transmittance of the second display area AA2. In a group comprising one first sub-pixel 110 positioned in the first display area AA1 and one second sub-pixel 210 positioned in the second display area AA2 emitting a same color, the area of the first pixel electrode 111 of the first sub-pixel 110 in the first display area AA1 is smaller than the area of the second pixel electrode 211 of the second sub-pixel 210 in the second display area AA2, so that each first pixel 100 in the first display area AA1 may have more areas where the light-transmitting structure can be arranged, thereby improving the light transmittance of the first display area AA1 and facilitating the under-screen integration of the photosensitive component 2000.

In some embodiments, the first pixel electrode 111 and the second pixel electrode 211 of the display panel 1000 have the same layer structure. Furthermore, in some optional embodiments, the first pixel electrode 111 and the second pixel electrode 211 have the same thickness, so that the parameters such as the display viewing angle and the color coordinates of the first display area AA1 and the second display area AA2 tend to be consistent, thereby greatly improving the display difference between the first display area AA1 and the second display area AA2, and improving the display integration effect of the display panel 1000.

In some embodiments, in the display panel 1000, in the group including the first sub-pixels 110 and the second sub-pixels 210 emitting the same color, the ratio of the area of the first pixel electrode 111 of one first sub-pixel 110 to the area of the second pixel electrode 211 of one second sub-pixel 210 is in the range of 0.2 to 0.6. The arrangement of the first pixel electrode 111 can balance the light transmittance of the first display area AA1, the light-emitting efficiency of the pixels in the first display area AA1, the viewing angle difference between the first display area AA1 and the second display area AA2, and the like, and thus the first display area AA1 with a sufficient light transmittance and light-emitting efficiency and a small viewing angle difference from the second display area AA2 can be obtained.

According to the above-described embodiments of this application, these embodiments do not describe all the details in detail, nor do they limit this application to only the specific embodiments described. Obviously, many modifications and changes can be made based on the above description. In the description, these embodiments are selected and specifically described in order to better explain principles and practical applications of this application, so that those skilled in the art can make good use of this application and make modifications based on this application. This application is only limited by the claims and their full scope and equivalents.

What is claimed is:

1. A display panel comprising:
a first display area, wherein a plurality of first pixels is located in the first display area, each of the first pixels of the plurality of first pixels comprises a plurality of first sub-pixels, and each of the first sub-pixels of the plurality of first sub-pixels comprises a first pixel electrode;
a second display area, wherein a plurality of second pixels is located in the second display area, each of the second pixels of the plurality of second pixels comprises a plurality of second sub-pixels, each of the second sub-pixels of the plurality of second sub-pixels comprises a second pixel electrode;
a transition display area located between the first display area and the second display area, wherein a plurality of first pixel circuits located in the transition display area is configured to drive the first sub-pixels to display, and each of the first pixel circuits of the plurality of first pixel circuits is electrically connected with two or more of the first sub-pixels of a same color, wherein a light transmittance of the first display area is greater than a light transmittance of the second display area, and,
in a pixel group comprising one of the plurality of first sub-pixels and one of the plurality of second sub-pixels emitting a same color, an area of the first pixel electrode of the first sub-pixel is smaller than an area of the second pixel electrode of the second sub-pixel.

2. The display panel of claim 1, wherein in the pixel group comprising one of the plurality of first sub-pixels and one of the plurality of second sub-pixels emitting the same color, a ratio of the area of the first pixel electrode of the first sub-pixel to the area of the second pixel electrode of the second sub-pixel is in a range of 0.2 to 0.6.

3. The display panel of claim 1, wherein in the pixel group comprising one of the plurality of first sub-pixels and one of the plurality of second sub-pixels emitting the same color, a ratio of the area of the first pixel electrode of the first sub-pixel to the area of the second pixel electrode of the second sub-pixel is in a range of 0.25 to 0.6.

4. The display panel of claim 1, wherein a ratio of a total area of a plurality of first pixel electrodes in each of the first pixels to a pixel area of the first pixel is in a range of 0.03 to 0.25.

5. The display panel of claim 1, wherein a ratio of a total area of a plurality of first pixel electrodes in each of the first pixels to a pixel area of the first pixel is in a range of 0.1 to 0.2.

6. The display panel of claim 1, wherein each first sub-pixel of the plurality of first sub-pixels comprises a first light-emitting area and a first non-light-emitting area having a shape complementary to a shape of the first light-emitting area in the first sub-pixel and a ratio of a total area of a plurality of the first light-emitting areas in each of the first pixels to a pixel area of the first pixel is in a range of 0.03 to 0.25.

7. The display panel of claim 6, wherein the ratio of the total area of the plurality of the first light-emitting areas in each of the first pixels to the pixel area of the first pixel is in a range of 0.08 to 0.2.

8. The display panel of claim 1, wherein the first pixel electrode and the second pixel electrode have a same layer structure, and/or, the first pixel electrode and the second pixel electrode have a same thickness.

9. The display panel of claim 1, wherein the first pixel electrode is located in a non-edge area corresponding to the first sub-pixel.

10. The display panel of claim 1, wherein each of the first sub-pixels further comprises a first light-emitting structure located on the first pixel electrode and a first electrode block located on the first light-emitting structure.

11. The display panel of claim 10, wherein the first electrode blocks of at least some of the first sub-pixels are interconnected via a connection portion to form a first common electrode, and the first common electrode covers at least a part of the first display area.

12. The display panel of claim 11, wherein a light transmittance of the connection portion is greater than a light transmittance of the first electrode block.

13. The display panel of claim 11, wherein the first common electrode is a magnesium-silver alloy layer, and a thickness of the connection portion is smaller than a thickness of the first electrode block.

14. The display panel of claim 10, wherein each second sub-pixel of the plurality of second sub-pixels further comprises:
a second light-emitting structure located on the second pixel electrode and
a second electrode block located on the second light-emitting structure, the second electrode blocks of at least some of the plurality of second sub-pixels are interconnected to form a second common electrode, the second common electrode covers at least a part of the second display area, and a light transmittance of the first electrode block is same as a light transmittance of the second common electrode.

15. The display panel of claim 14, wherein both the first electrode block and the second common electrode are magnesium-silver alloy layers, and a thickness of the first electrode block is equal to a thickness of the second common electrode.

16. The display panel of claim 1, further comprising:
a plurality of third pixels located in the transition display area, wherein each third pixel of the plurality of third pixels comprises a plurality of third sub-pixels; and further comprising:
a plurality of third pixel circuits located in the transition display area that is configured to drive the third sub-pixels to display, wherein each pixel circuit of the plurality of third pixel circuits is electrically connected with two or more of the third sub-pixels of a same color.

17. The display panel of claim 1, further comprising:
a substrate; and
a first pixel definition layer located on the substrate and in the first display area, wherein the first pixel definition layer comprises a plurality of first pixel openings, and each first pixel opening of the plurality of first pixel openings accommodates a first light-emitting structure of one of the plurality of first sub-pixels.

18. The display panel of claim 17, wherein an orthographic projection of each first pixel electrode on the substrate comprises one first graphic unit or two or more first graphic units jointed together, and the first graphic unit is formed into a shape or a combination of shapes selected from a round shape, an oval shape, a dumb-bell shape, a gourd shape and a rectangle shape.

19. A display apparatus comprising the display panel of claim 1, wherein the display panel comprises a first surface and a second surface opposite to each other, the first surface is a display surface, and the display apparatus further comprises:
a photosensitive component located on a second surface side of the first display area of the display panel.

20. A display panel comprising:
a first display area, wherein a plurality of first pixels located in the first display area, each of the first pixels of the plurality of first pixels comprises a plurality of first sub-pixels, and each of the first sub-pixels of the plurality of first sub-pixels comprises a first pixel electrode;
a second display area, wherein a plurality of second pixels is located in the second display area, each of the second pixels of the plurality of second pixels comprises a plurality of second sub-pixels, each of the second sub-pixels of the plurality of second sub-pixels comprises a second pixel electrode, wherein a light transmittance of the first display area is greater than a light transmittance of the second display area,
in a pixel group comprising one of the plurality of first sub-pixels and one of the plurality of second sub-pixels emitting a same color, an area of the first pixel electrode of the first sub-pixel is smaller than an area of the second pixel electrode of the second sub-pixel,
each of the first sub-pixels further comprises a first light-emitting structure located on the first pixel electrode and a first electrode block located on the first light-emitting structure,
each second sub-pixel of the plurality of second sub-pixels further comprises: a second light-emitting structure located on the second pixel electrode, and a second electrode block located on the second light-emitting structure, the second electrode blocks of at least some of the plurality of second sub-pixels are interconnected to form a second common electrode, the second common electrode covers at least a part of the second display area, and a light transmittance of the first electrode block is same as a light transmittance of the second common electrode, and
both the first electrode block and the second common electrode are magnesium-silver alloy layers, and a thickness of the first electrode block is equal to a thickness of the second common electrode.

21. A display panel comprising:
a first display area, wherein a plurality of first pixels located in the first display area, each of the first pixels of the plurality of first pixels comprises a plurality of first sub-pixels, and each of the first sub-pixels of the plurality of first sub-pixels comprises a first pixel electrode;
a second display area, wherein a plurality of second pixels is located in the second display area, each of the second pixels of the plurality of second pixels comprises a plurality of second sub-pixels, each of the second sub-pixels of the plurality of second sub-pixels comprises a second pixel electrode, wherein a light transmittance of the first display area is greater than a light transmittance of the second display area,
a pixel group comprising one of the plurality of first sub-pixels and one of the plurality of second sub-pixels emitting a same color, each of the plurality of first sub-pixels further comprises a first light-emitting structure located on the first pixel electrode and a first electrode block located on the first light-emitting structure, each of the plurality of second sub-pixels further comprises a second light-emitting structure located on the second pixel electrode and a second electrode block located on the second light-emitting structure, the second electrode blocks of at least some of the plurality of second sub-pixels are interconnected to form a second common electrode, both the first electrode block and the second common electrode are magnesium-silver alloy layers, and a thickness of the first electrode block is equal to a thickness of the second common electrode.

22. The display panel of claim 21, wherein the first pixel electrode and the second pixel electrode have a same layer structure, the first electrode blocks of at least some of the first sub-pixels are interconnected via a connection portion to form a first common electrode, and the first common electrode covers at least a part of the first display area.

23. The display panel of claim 21, wherein the display panel comprises:

a substrate; and a first pixel definition layer located on the substrate and in the first display area, wherein the first pixel definition layer comprises a plurality of first pixel openings, and each first pixel opening of the plurality of first pixel openings accommodates a first light-emitting structure of one of the plurality of first sub-pixels.

24. The display panel of claim 21, wherein an orthographic projection of each first pixel electrode on the substrate comprises one first graphic unit or two or more first graphic units jointed together, and the first graphic unit is formed into a shape or a combination of shapes selected from a round shape, an oval shape, a dumb-bell shape, a gourd shape and a rectangle shape.

25. A display apparatus comprising the display panel of claim 21, wherein the display panel comprises a first surface and a second surface opposite to each other, the first surface is a display surface, and the display apparatus further comprises:

a photosensitive component located on a second surface side of the first display area of the display panel.

* * * * *